United States Patent
Park et al.

(10) Patent No.: US 9,653,213 B2
(45) Date of Patent: *May 16, 2017

(54) MULTILAYER CERAMIC CAPACITOR AND BOARD HAVING THE SAME

(71) Applicant: SAMSUNG ELECTRO-MECHANICS CO., LTD., Suwon-Si, Gyeonggi-Do (KR)

(72) Inventors: Sang Soo Park, Suwon-Si (KR); Min Cheol Park, Suwon-Si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 135 days.

This patent is subject to a terminal disclaimer.

(21) Appl. No.: 14/645,357

(22) Filed: Mar. 11, 2015

(65) Prior Publication Data

US 2016/0111214 A1 Apr. 21, 2016

(30) Foreign Application Priority Data

Oct. 15, 2014 (KR) .................. 10-2014-0139025

(51) Int. Cl.
*H01G 4/30* (2006.01)
*H05K 1/02* (2006.01)
(Continued)

(52) U.S. Cl.
CPC .............. *H01G 4/30* (2013.01); *H01G 2/065* (2013.01); *H01G 4/012* (2013.01); *H05K 1/0216* (2013.01); *H05K 1/111* (2013.01); *H05K 1/181* (2013.01); *H01G 4/1227* (2013.01); *H05K 2201/0784* (2013.01)

(58) Field of Classification Search
CPC .. H01G 4/30; H01G 4/06; H01G 4/35; H01G 4/228
See application file for complete search history.

(56) References Cited

U.S. PATENT DOCUMENTS

2008/0158773 A1* 7/2008 Lee .................. H01G 4/005
361/306.3
2012/0162853 A1 6/2012 Togashi
(Continued)

FOREIGN PATENT DOCUMENTS

JP 2012-138415 A 7/2012
KR 10-2009-0059748 A 6/2009

*Primary Examiner* — Nguyen Ha
(74) *Attorney, Agent, or Firm* — McDermott Will & Emery LLP

(57) ABSTRACT

A multilayer ceramic capacitor may include a ceramic body having first to third dielectric layers, first and third internal electrodes disposed to be partially exposed to an upper surface of the ceramic body, second and fourth internal electrodes disposed to be partially exposed to a lower surface of the ceramic body, internal resistance electrodes disposed on the third dielectric layers and partially exposed to the upper surface of the ceramic body, first and third external electrodes disposed on the ceramic body to be connected to the first and third internal electrodes, second and fourth external electrodes disposed to be connected to the second and fourth internal electrodes. The first and third external electrodes are electrically connected to each other by the internal resistance electrodes.

14 Claims, 8 Drawing Sheets

(51) Int. Cl.
*H05K 1/18* (2006.01)
*H05K 1/11* (2006.01)
*H01G 2/06* (2006.01)
*H01G 4/012* (2006.01)
*H01G 4/12* (2006.01)

(56) References Cited

U.S. PATENT DOCUMENTS

2013/0319741 A1* 12/2013 Ahn .................. H01G 4/30
 174/260
2016/0086731 A1* 3/2016 Park .................. H01G 2/065
 174/260

* cited by examiner

MULTILAYER CERAMIC CAPACITOR AND BOARD HAVING THE SAME

CROSS-REFERENCE TO RELATED APPLICATION

This application claims the priority and benefit of Korean Patent Application No. 10-2014-0139025 filed on Oct. 15, 2014, with the Korean Intellectual Property Office, the disclosure of which is incorporated herein by reference.

BACKGROUND

The present disclosure relates to a multilayer ceramic capacitor and a board having the same.

A multilayer ceramic capacitor, a multilayer chip electronic component, is a chip type condenser commonly mounted on the boards of various electronic products such as display devices including liquid crystal displays (LCDs), plasma display panels (PDPs), and the like, as well as computers, personal digital assistants (PDAs), and mobile phones, serving to charge electricity in the batteries thereof or discharge electricity therefrom.

Such a multilayer ceramic capacitor may be used as components of various electronic apparatuses due to advantages thereof, such as a small size, high capacitance, and ease of mounting.

Recently, in accordance with miniaturization and thinning of electronic components, high frequency noise generated in internal circuits has become problematic.

Thus, it is necessary to adjust the equivalent series resistance (ESR) of capacitors in order to solve the problem of high frequency noise.

RELATED ART DOCUMENT (Patent Document 1) Korean Patent Laid-Open Publication No. 2009-0059748
(Patent Document 2) Japanese Patent Laid-Open Publication No. 2012-138415

SUMMARY

An exemplary embodiment in the present disclosure may provide a multilayer ceramic capacitor in which a desired level of equivalent series resistance (ESR) may be easily realized.

According to an aspect of the present disclosure, a multilayer ceramic capacitor may include: a ceramic body having first to third dielectric layers layered in a width direction; first internal electrodes disposed on the first dielectric layers and partially exposed to an upper surface of the ceramic body; second internal electrodes disposed on the second dielectric layers and partially exposed to a lower surface of the ceramic body; third internal electrodes disposed on the first dielectric layers and partially exposed to the upper surface of the ceramic body; fourth internal electrodes disposed on the second dielectric layers and partially exposed to the lower surface of the ceramic body; internal resistance electrodes disposed on the third dielectric layers and partially exposed to the upper surface of the ceramic body; a first external electrode disposed on the upper surface of the ceramic body and connected to the first internal electrodes; a second external electrode disposed on the lower surface of the ceramic body and connected to the second internal electrodes; a third external electrode disposed on the upper surface of the ceramic body, connected to the third internal electrodes, and disposed to be spaced apart from the first external electrode; and a fourth external electrode disposed on the lower surface of the ceramic body, connected to the fourth internal electrodes, and disposed to be spaced apart from the second external electrode, wherein the first and third external electrodes are electrically connected to each other by the internal resistance electrodes.

According to another aspect of the present disclosure, a board having a multilayer ceramic capacitor may include: a circuit board having first and second electrode pads disposed on the circuit board; and a multilayer ceramic capacitor disposed on the circuit board, wherein the multilayer ceramic capacitor includes: a ceramic body having first to third dielectric layers layered in a width direction; first internal electrodes disposed on the first dielectric layers and partially exposed to an upper surface of the ceramic body; second internal electrodes disposed on the second dielectric layers and partially exposed to a lower surface of the ceramic body; third internal electrodes disposed on the first dielectric layers and partially exposed to the upper surface of the ceramic body; fourth internal electrodes disposed on the second dielectric layers and partially exposed to the lower surface of the ceramic body; internal resistance electrodes disposed on the third dielectric layers and partially exposed to the upper surface of the ceramic body; a first external electrode disposed on the upper surface of the ceramic body and connected to the first internal electrodes; a second external electrode disposed on the lower surface of the ceramic body and connected to the second internal electrodes; a third external electrode disposed on the upper surface of the ceramic body, connected to the third internal electrodes, and disposed to be spaced apart from the first external electrode; and a fourth external electrode disposed on the lower surface of the ceramic body, connected to the fourth internal electrodes, and disposed to be spaced apart from the second external electrode, the first and third external electrodes being electrically connected to each other by the internal resistance electrodes.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
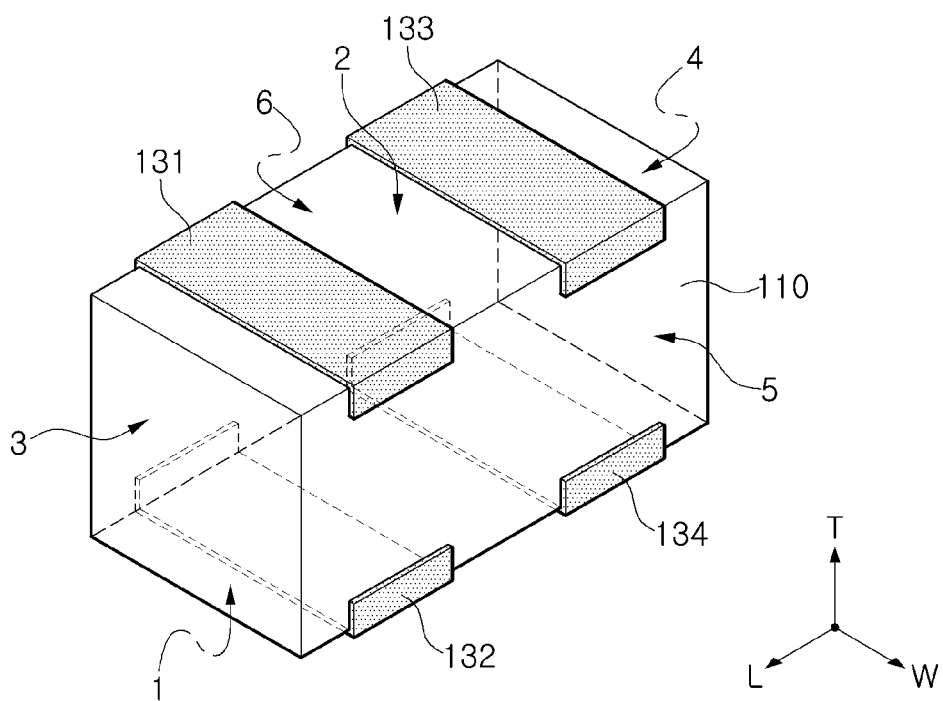
FIG. 1 is a schematic perspective view of a multilayer ceramic capacitor according to an exemplary embodiment of the present disclosure.

Exemplary embodiments of the present disclosure will now be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Directions of a hexahedron will be defined in order to clearly describe exemplary embodiments of the present disclosure. L, W and T shown in the accompanying drawings refer to a length direction, a width direction, and a thickness direction, respectively.

Multilayer Ceramic Capacitor

Figure 2:
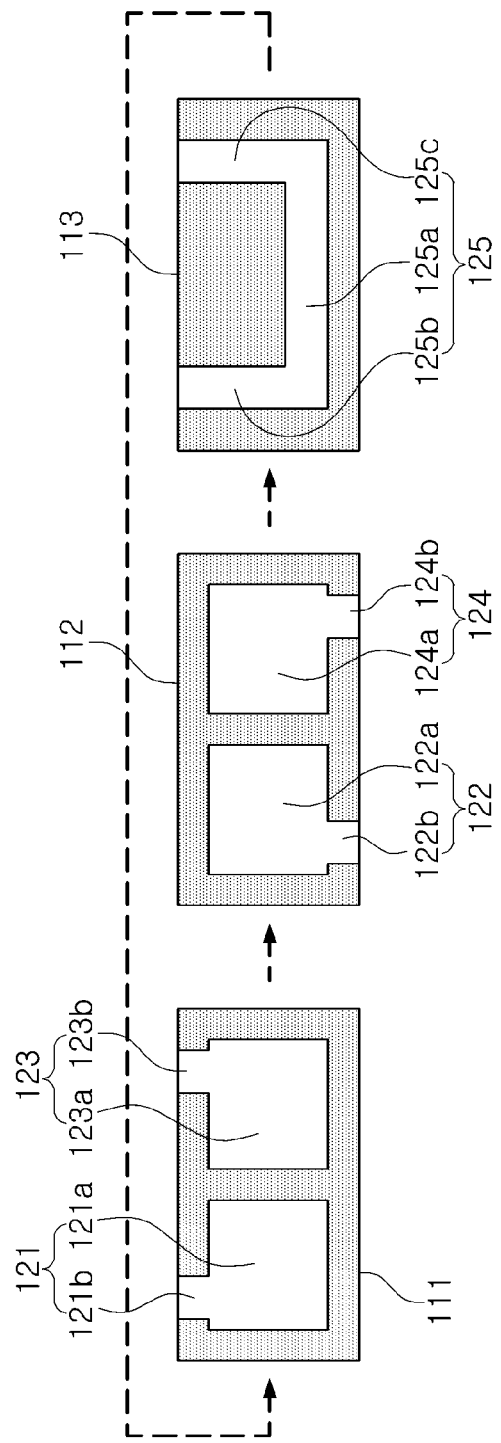
FIG. 2 is a cross-sectional view schematically showing an example of internal electrodes of the multilayer ceramic capacitor of FIG. 1.

FIG. 1 is a schematic perspective view of a multilayer ceramic capacitor 100 according to an exemplary embodiment of the present disclosure; and FIG. 2 is a cross-sectional view schematically showing an example of internal electrodes of the multilayer ceramic capacitor of FIG. 1.

Referring to FIG. 1, the multilayer ceramic capacitor 100 according to an exemplary embodiment of the present disclosure may include a ceramic body 110 having a lower surface 1 and an upper surface 2 and first to fourth external electrodes 131 to 134.

The lower surface 1 of the ceramic body 110 may be provided as a mounting surface when the multilayer ceramic capacitor is mounted on a circuit board.

The ceramic body 110 may be a hexahedron that may have the lower surface 1 and the upper surface 2, have both end surfaces 3 and 4 in the length direction and both side surfaces 5 and 6 in the width direction, but is not limited thereto.

In detail, in an exemplary embodiment of the present disclosure, first and second main surfaces 1 and 2 refer to surfaces of the ceramic body 110 opposing each other in the thickness direction, first and second end surfaces 3 and 4 refer to surfaces of the ceramic body 110 connecting the first and second main surfaces 1 and 2 to each other and opposing each other in the length direction, and first and second side surfaces 5 and 6 refer to surfaces of the ceramic body 110 opposing each other in the width direction.

Referring to FIGS. 1 and 2, the ceramic body 110 may be formed by stacking a plurality of dielectric layers 111 to 113 in the width direction and then sintering the plurality of dielectric layers 111 to 113.

However, a shape of the ceramic body 110 according to the present disclosure and the number of stacked dielectric layers 111 to 113 are not limited to those of the present disclosure shown in FIGS. 1 and 2.

In the case of the dielectric layers 111 to 113 forming the ceramic body 110, adjacent dielectric layers 111 to 113 may be integrated with each other so that boundaries therebetween are not readily apparent without using a scanning electron microscope (SEM).

First and third internal electrodes 121 and 123 may be disposed on first dielectric layers 111, and second and fourth internal electrodes 122 and 124 may be disposed on second dielectric layers 112.

That is, the first and third internal electrodes 121 and 123 may be disposed on the same first dielectric layers 111 while being spaced apart from each other, and the second and fourth internal electrodes 122 and 124 may be disposed on the same second dielectric layers 122 while being spaced apart from each other.

The respective internal electrodes 121 to 124 may be disposed to be exposed to at least one surface.

The respective internal electrodes 121 to 124 may include capacitance parts 121a to 124a contributing to forming a capacitance of the multilayer ceramic capacitor and lead parts 121b to 124b exposed to one surface, respectively.

A first lead part 121b may be extended from a first capacitance part 121a to the upper surface 2 of the ceramic body 110 to be led through the upper surface 2 of the ceramic body 110, and a second lead part 122b may be extended from a second capacitance part 122a to the lower surface 1 of the ceramic body 110 to be led through the lower surface 1 of the ceramic body 110.

The first lead part 121b of the first internal electrode 121 may be electrically connected to the first external electrode 131, and the second lead part 122b of the second internal electrode 122 may be electrically connected to the second external electrode 132.

The first capacitance part 121a of the first internal electrode 121 and the second capacitance part 122a of the second internal electrode 122 may be overlapped with each other in the width direction and have different polarities to contribute to forming the capacitance.

Likewise, a third lead part 123b may be extended from a third capacitance part 123a to the upper surface 2 of the ceramic body 110 to be led through the upper surface 2 of the ceramic body 110, and a fourth lead part 124b may be extended from a fourth capacitance part 124a to the lower surface 1 of the ceramic body 110 to be led through the lower surface 1 of the ceramic body 110.

The third lead part 123b of the third internal electrode 123 may be electrically connected to the third external electrode 133, and the fourth lead part 124b of the fourth internal electrode 124 may be electrically connected to the fourth external electrode 134.

The third capacitance part 123a of the third internal electrode 123 and the fourth capacitance part 124a of the fourth internal electrode 124 may be overlapped with each other in the width direction and have different polarities to contribute to forming the capacitance.

Here, the capacitance of the multilayer ceramic capacitor 100 may be in proportion to an area of the first and second internal electrodes overlapped with each other and an area of the third and fourth internal electrodes overlapped with each other.

In addition, a total capacitance of the multilayer ceramic capacitor 100 may be (capacitances of first and second internal electrodes×capacitances of third and fourth internal electrodes)/(capacitances of first and second internal electrodes+capacitances of third and fourth internal electrodes).

Internal resistance electrodes 125 may be formed on third dielectric layers 113.

The internal resistance electrode 125 may be formed using a resist paste.

The internal resistance electrode 125 may be led to the upper surface 2 of the ceramic body through fifth and sixth lead parts 125b and 125c.

A resistance value of the internal resistance electrode 125 may be determined by adjusting a material, a width, or a length of a resistance portion 125a.

The fifth and sixth lead parts 125b and 125c may also be formed using a resist paste, if necessary.

The internal resistance electrode 125, which hinders a flow of a current to allow resistance characteristics to be implemented, may be adjusted so that an appropriate resistance value may be implemented.

In order to adjust the resistance value of the internal resistance electrode 125, a material of the internal resistance electrode 125 may be changed to adjust conductivity, a width, or a length of the internal resistance electrode 125 may be adjusted.

The first to fourth internal electrodes 121 to 124 may be formed by printing a conductive paste containing a conductive metal on at least one surface of ceramic sheets forming the dielectric layers 111 and 112.

The conductive metal contained in the conductive paste may be one of, for example, silver (Ag), palladium (Pd), platinum (Pt), nickel (Ni), and copper (Cu), an alloy thereof, or the like. However, the present disclosure is not limited thereto.

In addition, as a method of printing the conductive paste, a screen printing method, a gravure printing method, or the like, may be used. However, the present disclosure is not limited thereto.

Although not shown, dielectric layers on which internal electrodes are not formed, that is, cover layers may be formed on both end portions of the ceramic body 110 in the width direction.

The cover layers may serve to prevent the first to fourth internal electrodes 121 to 124 from being damaged by physical or chemical stress.

The dielectric layers 111 to 113 may contain a high-k ceramic material.

The dielectric layers 111 to 113 may contain, for example, barium titanate ($BaTiO_3$) based ceramic powders, or the like. However, the present disclosure is not limited thereto as long as a sufficient capacitance may be obtained.

In addition, the dielectric layers 111 to 113 may further contain a ceramic additive, an organic solvent, a plasticizer, a binder, a dispersant, and the like, if necessary, in addition to the ceramic material.

Here, as the ceramic additive, various kinds of materials such as a transition metal oxide or carbide, rare earth elements, magnesium (Mg), aluminum (Al), and the like, may be used.

The internal electrodes of the multilayer ceramic capacitor 100 according to an exemplary embodiment of the present disclosure may be formed by stacking the first dielectric layers 111 on which the first and third internal electrodes 121 and 123 are formed, the second dielectric layers 112 on which the second and fourth internal electrodes 122 and 124 are formed, and the third dielectric layers 113 on which the internal resistance electrode 125 is formed by way of example.

The third dielectric layers 113 may be stacked after the first and second dielectric layers 111 and 112 are alternately stacked or be disposed between the first and second dielectric layers 111 and 112 that are stacked.

The first and third external electrodes 131 and 133 may be formed on the upper surface 2 of the ceramic body 110 to be spaced apart from each other in the length direction, the first external electrode 131 may be connected to the first lead part 121b of the first internal electrode 121, and the third external electrode 133 may be connected to the third lead part 123b of the third internal electrode 123.

The second and fourth external electrodes 132 and 134 may be formed on the lower surface 1 of the ceramic body 110 to be spaced apart from each other in the length direction, the second external electrode 132 may be connected to the second lead part 122b of the second internal electrode 122, and the fourth external electrode 134 may be connected to the fourth lead part 124b of the fourth internal electrode 124.

Here, the first and third external electrodes 131 and 133 may be extended from the upper surface 2 of the ceramic body 110 to portions of the side surfaces 5 and 6 of the ceramic body 110 in the width direction in order to improve sticking strength.

In addition, the second and fourth external electrodes 132 and 134 may be extended from the lower surface 1 of the ceramic body 110 to portions of the side surfaces 5 and 6 of the ceramic body 110 in the width direction in order to improve sticking strength.

In the multilayer ceramic capacitor 100 having the electrode structure as described above, a current loop may be decreased to decrease an equivalent series inductance (ESL).

In addition, in an exemplary embodiment of the present disclosure, even in the case in which a short-circuit is generated in one of capacitors configuring the multilayer ceramic capacitor, the other capacitors may be normally operated.

The first to fourth external electrodes 131, 132, 133, and 134 may be formed of a conductive paste containing a conductive metal.

The conductive metal may be one of, for example, nickel (Ni), copper (Cu), and tin (Sn), an alloy thereof, or the like, but is not limited thereto.

The conductive paste may further contain an insulating material.

The insulating material may be, for example, glass. However, the present disclosure is not limited thereto.

Further, in the present disclosure, a method of forming the first to fourth external electrodes 131 to 134 is not particularly limited. That is, several methods such as a method of forming the first to fourth external electrodes 131 to 134 by dipping the ceramic body 110 in a conductive paste, a method of forming the first to fourth external electrodes 131 to 134 by plating, and the like, may be used.

Meanwhile, a plating layer (not shown) may be further formed on the first to fourth external electrodes 131 to 134 by a method such as an electroplating method, or the like.

The plating layer may include a nickel (Ni) plating layer formed on the first to fourth external electrodes 131 to 134 and a tin (Sn) plating layer formed on the nickel plating layer.

The plating layer may be to increase adhesion strength between the multilayer ceramic capacitor 100 and a circuit board when the multilayer ceramic capacitor 100 is mounted on the circuit board, or the like, using solders.

Figure 3:
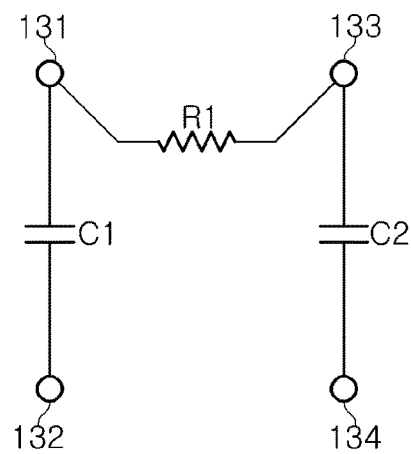
FIG. 3 is a circuit diagram of the multilayer ceramic capacitor according to an exemplary embodiment of the present disclosure.
Figure 4:
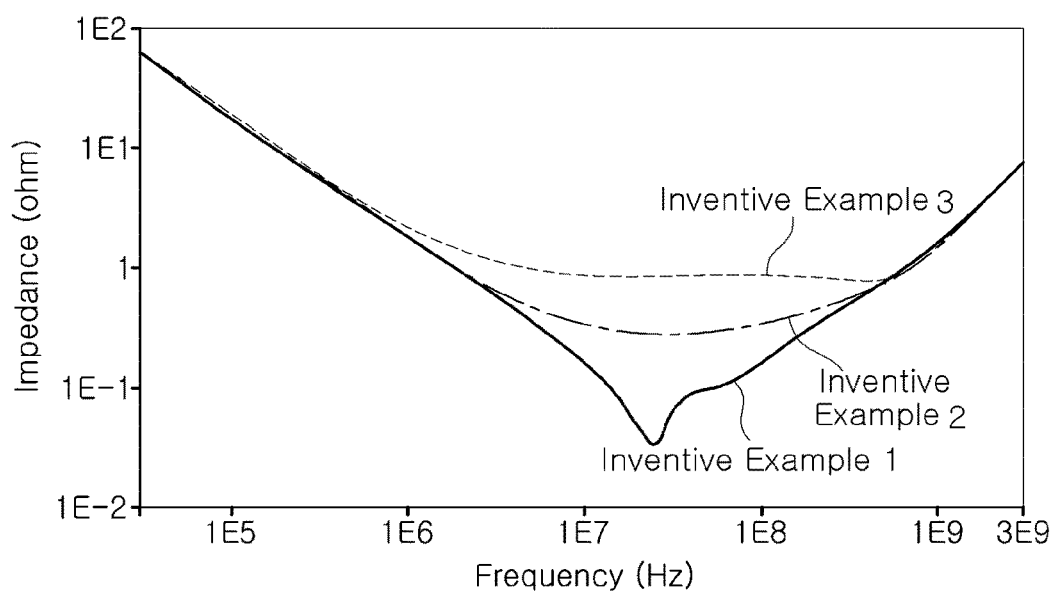
FIG. 4 is a graph showing a measurement result of equivalent series resistance (ESR) depending on a resistance value of an internal resistance electrode of the multilayer ceramic capacitor according to an exemplary embodiment of the present disclosure.

FIG. 3 is a circuit diagram of the multilayer ceramic capacitor according to an exemplary embodiment of the present disclosure; and FIG. 4 is a graph showing a measurement result of equivalent series resistance (ESR) of the multilayer ceramic capacitor according to an exemplary embodiment of the present disclosure.

Referring to FIGS. 1 through 4, it may be appreciated that the first and third external electrodes 131 and 133 are connected to each other by the internal resistance electrode 125 in the multilayer ceramic capacitor 100 according to an exemplary embodiment of the present disclosure.

A resistance value of the internal resistance electrode 125 may be determined by adjusting a material, a width, or a length of a resistance portion 125a.

The internal resistance electrode 125, which hinders a flow of a current to allow resistance characteristics to be implemented, may be adjusted so that an appropriate resistance value may be implemented.

That is, as shown in FIG. 4, the resistance value of the internal resistance electrode may be adjusted to adjust ESR, as in Inventive Examples 1 to 3.

Referring to FIG. 3, it may be appreciated that the multilayer ceramic capacitor according to an exemplary embodiment of the present disclosure has a structure in which a capacitor C1 and a capacitor C2 are connected in series with each other with a resistor R1 interposed therebetween.

A resistance value of the resistor R1 may be adjusted by conductivity, a width, or a length of the internal resistance electrode 125. Therefore, the ESR value of the multilayer ceramic capacitor may be adjusted.

In addition, in the multilayer ceramic capacitor according to an exemplary embodiment of the present disclosure, since the capacitors are disposed in series with each other, even in the case in which any one of the capacitors is short-circuited due to an over-voltage or mechanical stress, an insulation resistance may be maintained to have high reliability.

Figure 5:
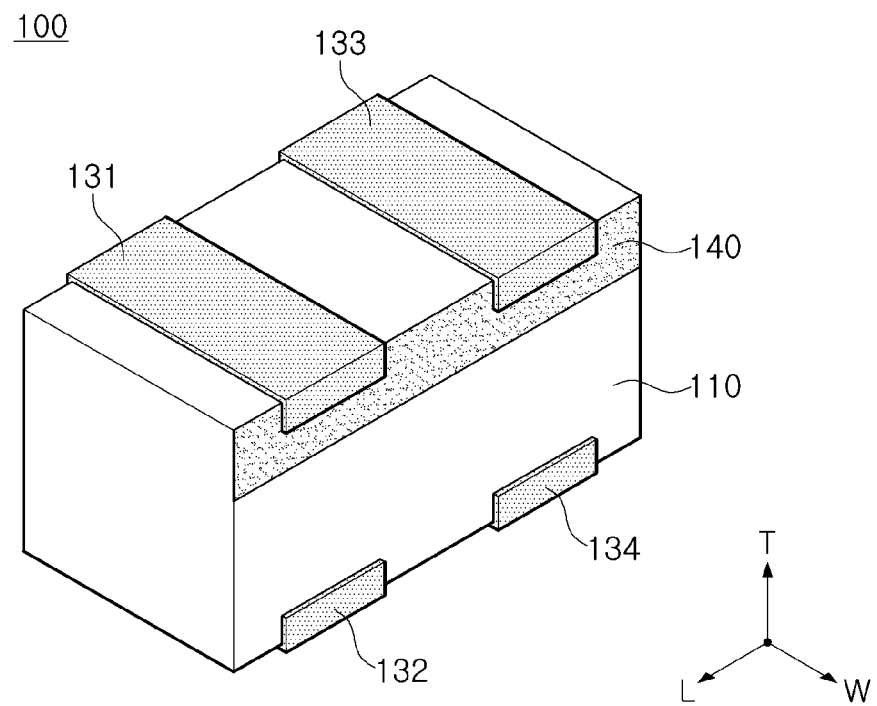
FIG. 5 is a schematic perspective view of a multilayer ceramic capacitor according to another exemplary embodiment of the present disclosure.

FIG. 5 is a schematic perspective view of a multilayer ceramic capacitor 100 according to another exemplary embodiment of the present disclosure.

Since the first and third external electrodes 131 and 133 of the multilayer ceramic capacitor 100 according to an exemplary embodiment of the present disclosure are connected to each other by the internal resistance electrode 125, it may difficult to distinguish the upper and lower surfaces of the ceramic body from each other on an appearance of the ceramic body 110.

That is, since it is difficult to distinguish the upper and lower surfaces of the ceramic body 110 from each other, a defect may be caused in a mounting process.

Referring to FIG. 5, in the multilayer ceramic capacitor 100 according to another exemplary embodiment of the present disclosure, a mark 140 may be formed on a portion of the side surface of the ceramic body 110 close to the upper surface of the ceramic body.

That is, the mark 140 may serve to distinguish the upper and lower surfaces of the multilayer ceramic capacitor from each other on the appearance.

The mark 140 may be formed of a material that may be distinguished from a color or a material of the ceramic body 110 after the ceramic body 110 is sintered, but is not limited thereto.

Figure 6:
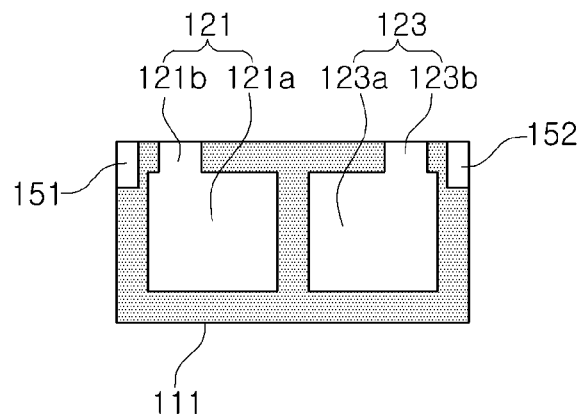
FIGS. 6 and 7 are cross-sectional views schematically showing a dielectric layer 111 having dummy electrodes formed thereon.
Figure 7:
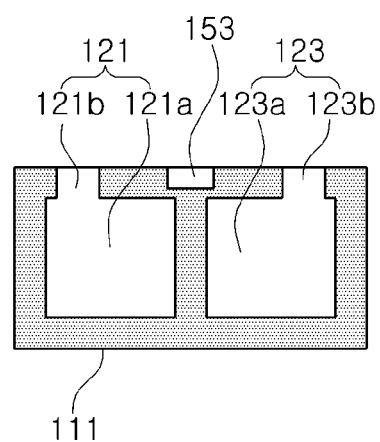

FIGS. 6 and 7 are cross-sectional views schematically showing a dielectric layer 111 having dummy electrodes 151 to 153 formed thereon.

Although the case in which the dummy electrodes 151 to 153 are formed on the first dielectric layer 111 has been shown in FIGS. 6 and 7, the dummy electrodes 151 to 153 may also be formed on the second and third dielectric layers 112 and 113.

Referring to FIG. 6, the dummy electrodes 151 and 152 may be formed at both distal ends of the dielectric layer 111 in the length direction.

That is, since the dummy electrodes 151 are formed at both distal ends of the dielectric layer 111, when the ceramic body 110 is completed by stacking the dielectric layers 111, the dummy electrodes 151 and 152 may be formed at end portions of the ceramic body 110 in the length direction.

Particularly, the dummy electrodes 151 and 152 may be disposed to be close to the upper surface of the ceramic body 110 or to be exposed to the upper surface of the ceramic body 110.

Therefore, the dummy electrodes 151 and 152 may serve to distinguish the upper and lower surfaces of the multilayer ceramic capacitor from each other on the appearance.

In addition, the dummy electrodes 151 and 152 may be formed between the internal electrodes formed on the dielectric layer 111.

Referring to FIG. 7, the dummy electrode 153 may be formed between the first to third internal electrodes 121 and 123 and be disposed to be exposed to the upper surface of the ceramic body 110.

That is, the dummy electrode 153 may serve to distinguish the upper and lower surfaces of the multilayer ceramic capacitor from each other on the appearance.

The dummy electrodes 151 to 153 may not only serve to distinguish the upper and lower surfaces of the ceramic body 110 from each other, but also serve to remove a step generated at the time of performing stacking due to the internal electrodes.

Modified Example

Figure 8:
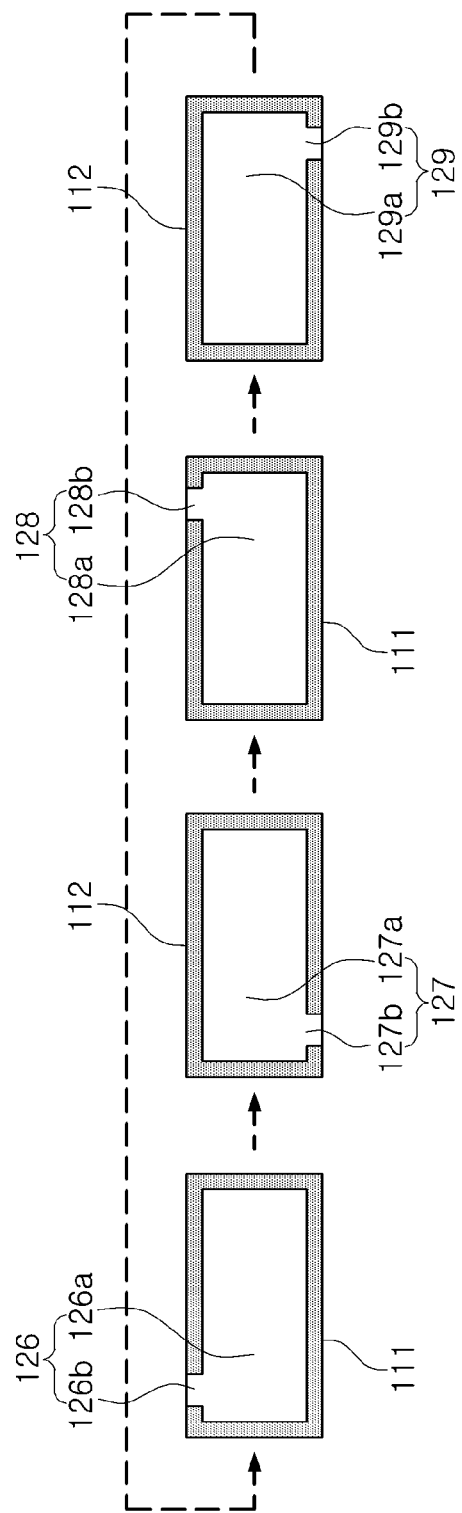
FIGS. 8 and 9 are cross-sectional views schematically showing an example of internal electrodes of a multilayer ceramic capacitor according to another exemplary embodiment of the present disclosure.
Figure 9:
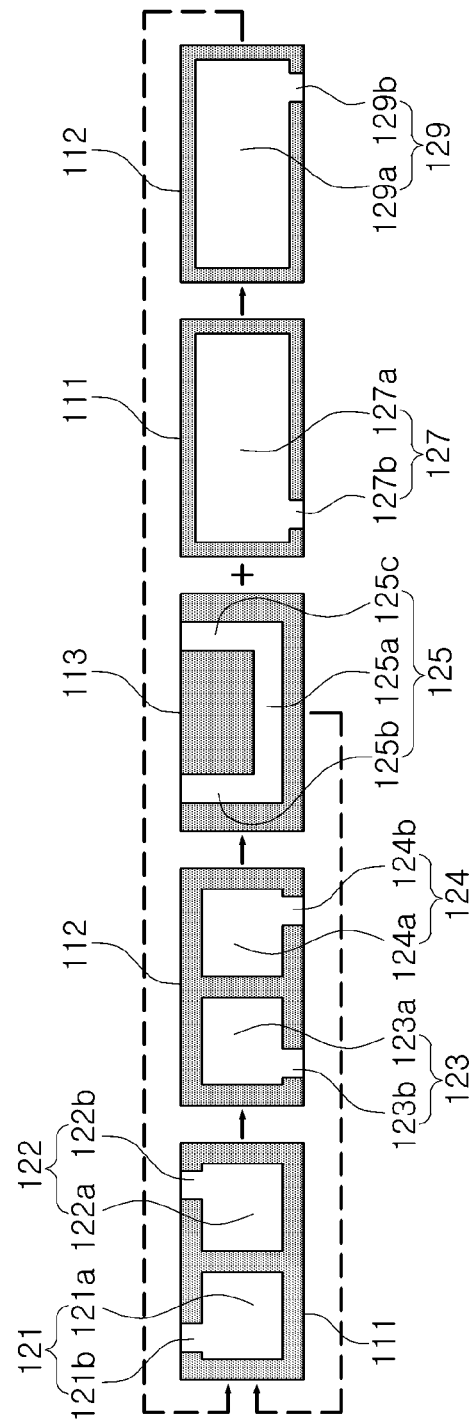

FIGS. 8 and 9 are cross-sectional views schematically showing an example of internal electrodes of a multilayer ceramic capacitor according to another exemplary embodiment of the present disclosure.

Referring to FIG. 8, in the case of the internal electrodes of FIG. 8 unlike FIG. 2, first and third internal electrodes 126 and 128 may be disposed on different first dielectric layers 111, and second and fourth internal electrodes 127 and 129 may be disposed on different second dielectric layers 122.

The first and third internal electrodes 126 and 128 may be disposed on the different first dielectric layers 111, and the second and fourth internal electrodes 127 and 129 may be disposed on the different second dielectric layers 122.

The respective internal electrodes 126 to 129 may be disposed to be exposed to at least one surface.

The respective internal electrodes 126 to 129 may include capacitance parts 126a to 129a contributing to forming a capacitance of the multilayer ceramic capacitor and lead parts 126b to 129b exposed to one surface, respectively.

A first lead part 126b may be extended from a first capacitance part 126a to the upper surface 2 of the ceramic body 110 to be led through the upper surface 2 of the ceramic body 110, and a second lead part 127b may be extended from a second capacitance part 127a to the lower surface 1 of the ceramic body 110 to be led through the lower surface 1 of the ceramic body 110.

The first lead part 126b of the first internal electrode 126 may be electrically connected to the first external electrode 131, and the second lead part 127b of the second internal electrode 127 may be electrically connected to the second external electrode 132.

The first capacitance part 126a of the first internal electrode 126 and the second capacitance part 127a of the second internal electrode 127 may be overlapped with each other in the width direction and have different polarities to contribute to forming the capacitance.

Likewise, a third lead part 128b may be extended from a third capacitance part 128a to the upper surface 2 of the ceramic body 110 to be led through the upper surface 2 of the ceramic body 110, and a fourth lead part 129b may be extended from a fourth capacitance part 129a to the lower surface 1 of the ceramic body 110 to be led through the lower surface 1 of the ceramic body 110.

The third lead part 128b of the third internal electrode 128 may be electrically connected to the third external electrode 133, and the fourth lead part 129b of the fourth internal electrode 129 may be electrically connected to the fourth external electrode 134.

The third capacitance part 128a of the third internal electrode 128 and the fourth capacitance part 129a of the fourth internal electrode 129 may be overlapped with each other in the width direction and have different polarities to contribute to forming the capacitance.

Here, the capacitance of the multilayer ceramic capacitor 100 may be in proportion to an area of the first and second internal electrodes overlapped with each other and an area of the third and fourth internal electrodes overlapped with each other.

Therefore, the first and second dielectric layers 111 and 112 shown in FIG. 8 and the third dielectric layers 113 including the internal resistance electrode 125 shown in FIG. 2 are stacked to form the ceramic body, whereby the multilayer ceramic capacitor having an adjustable ESR and a high capacitance may be provided.

In addition, as shown in FIG. 9, a multilayer ceramic capacitor in which the example of the internal electrodes shown in FIG. 2 and the example of the internal electrodes shown in FIG. 8 are combined with each other may be manufactured.

Figure 10:
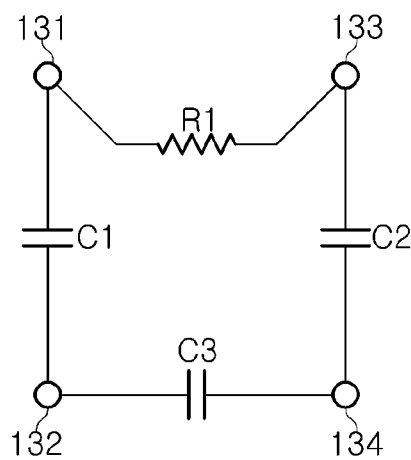
FIG. 10 is a circuit diagram of the multilayer ceramic capacitor according to another exemplary embodiment of the present disclosure.

In the case of combining the examples of the internal electrodes with each other as shown in FIG. 9, the multilayer ceramic capacitor may have a circuit diagram as shown in FIG. 10.

That is, an impedance may be easily adjusted in a wide band frequency region by a capacitor C.

Board Having Multilayer Ceramic Capacitor

Figure 11:
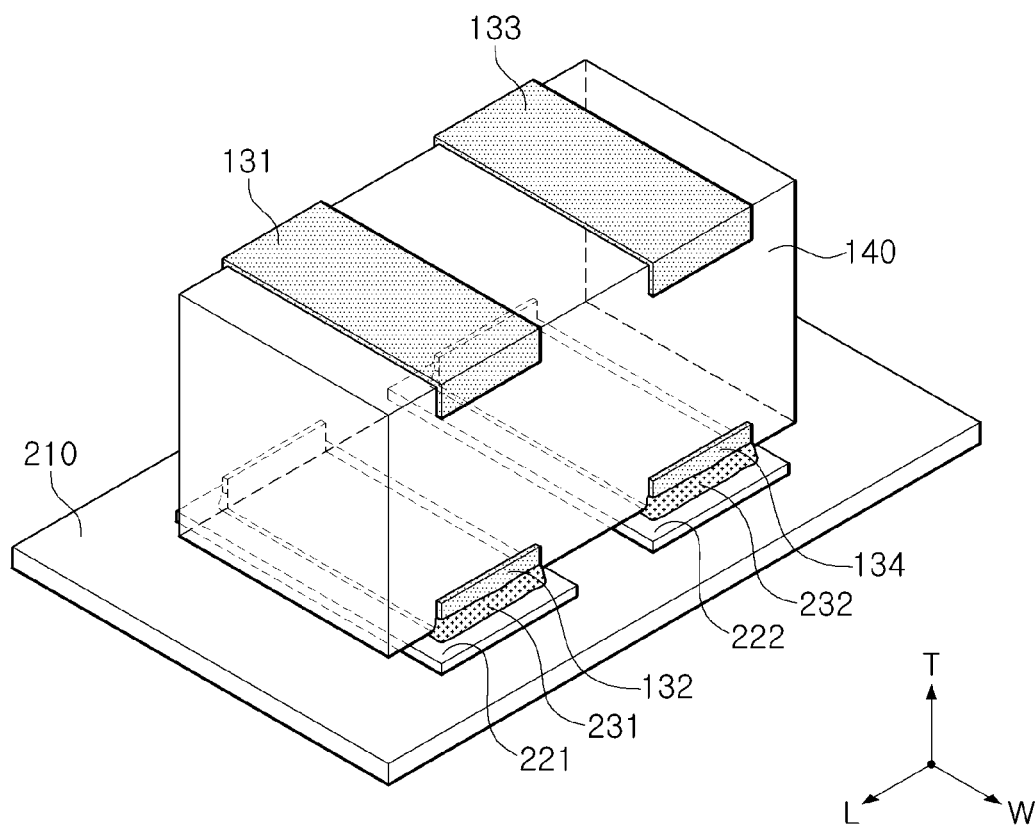
FIG. 11 is a schematic perspective view of a board having a multilayer ceramic capacitor according to an exemplary embodiment of the present disclosure.

FIG. 11 is a schematic perspective view of a board having a multilayer ceramic capacitor according to an exemplary embodiment of the present disclosure.

Referring to FIG. 11, the board having a multilayer ceramic capacitor 100 according to an exemplary embodiment of the present disclosure may include a circuit board 210 on which the multilayer ceramic capacitor 100 is horizontally mounted and first and second electrode pads 221 and 222 formed on an upper surface of the circuit board 210 to be spaced apart from each other.

Here, the third and fourth external electrodes 133 and 134 of the multilayer ceramic capacitor 100 may be disposed to be adjacent to the circuit board 210 and may be electrically connected to the circuit board 210 by solders 231 and 232 while being positioned on the first and second electrode pads 221 and 222, respectively, to contact the first and second electrode pads 221 and 222, respectively.

As set forth above, the multilayer ceramic capacitor according to an exemplary embodiment of the present disclosure may obtain a desire ESR by including the internal resistance electrodes formed in the ceramic body.

While exemplary embodiments have been shown and described above, it will be apparent to those skilled in the art that modifications and variations could be made without departing from the scope of the present invention as defined by the appended claims.

What is claimed is:

1. A multilayer ceramic capacitor comprising:
 a ceramic body having first to third dielectric layers layered in a width direction of the ceramic body, first internal electrodes disposed on the first dielectric layers and partially exposed to an upper surface of the ceramic body, second internal electrodes disposed on the second dielectric layers and partially exposed to a lower surface of the ceramic body, third internal electrodes disposed on the first dielectric layers and partially exposed to the upper surface of the ceramic body, fourth internal electrodes disposed on the second dielectric layers and partially exposed to the lower surface of the ceramic body and internal resistance electrodes disposed on the third dielectric layers and partially exposed to the upper surface of the ceramic body;
 a first external electrode disposed on the upper surface of the ceramic body and connected to the first internal electrodes;
 a second external electrode disposed on the lower surface of the ceramic body and connected to the second internal electrodes;
 a third external electrode disposed on the upper surface of the ceramic body, connected to the third internal electrodes, and disposed to be spaced apart from the first external electrode; and
 a fourth external electrode disposed on the lower surface of the ceramic body, connected to the fourth internal electrodes, and disposed to be spaced apart from the second external electrode,
 wherein the first and third external electrodes are electrically connected to each other by the internal resistance electrodes.

2. The multilayer ceramic capacitor of claim 1, wherein conductivity, widths, or lengths of the internal resistance electrodes are adjusted to adjust equivalent series resistance (ESR).

3. The multilayer ceramic capacitor of claim 1, wherein the first and third internal electrodes are disposed on the same first dielectric layers while being spaced apart from each other, and
 the second and fourth internal electrodes are disposed on the same second dielectric layers while being spaced apart from each other.

4. The multilayer ceramic capacitor of claim 1, wherein the first and third internal electrodes are disposed on different first dielectric layers, and
 the second and fourth internal electrodes are disposed on different second dielectric layers.

5. The multilayer ceramic capacitor of claim 1, further comprising dummy electrodes disposed on at least portions of the first to third dielectric layers and exposed to end surfaces of the ceramic body in a length direction of the ceramic body.

6. The multilayer ceramic capacitor of claim 1, further comprising a dummy electrode disposed on at least a portion of the first to third dielectric layers and exposed to the upper surface of the ceramic body.

7. The multilayer ceramic capacitor of claim 1, further comprising a mark formed on a portion of a side surface of the ceramic body close to the upper surface of the ceramic body.

8. A board having a multilayer ceramic capacitor, comprising:
 a circuit board having first and second electrode pads disposed on the circuit board; and
 a multilayer ceramic capacitor disposed on the circuit board,
 wherein the multilayer ceramic capacitor includes:
 a ceramic body having first to third dielectric layers layered in a width direction of the ceramic body, first internal electrodes disposed on the first dielectric layers and partially exposed to an upper surface of the ceramic body, second internal electrodes disposed on the second dielectric layers and partially exposed to a lower surface of the ceramic body, third internal electrodes disposed on the first dielectric layers and partially exposed to the upper surface of the ceramic body, fourth internal electrodes disposed on the second dielectric layers and partially exposed to the lower surface of the ceramic body and internal resistance electrodes disposed on the third dielectric layers and partially exposed to the upper surface of the ceramic body;

a first external electrode disposed on the upper surface of the ceramic body and connected to the first internal electrodes;

a second external electrode disposed on the lower surface of the ceramic body and connected to the second internal electrodes;

a third external electrode disposed on the upper surface of the ceramic body, connected to the third internal electrodes, and disposed to be spaced apart from the first external electrode; and a fourth external electrode disposed on the lower surface of the ceramic body, connected to the fourth internal electrodes, and disposed to be spaced apart from the second external electrode, the first and third external electrodes being electrically connected to each other by the internal resistance electrodes.

9. The board having a multilayer ceramic capacitor of claim 8, wherein conductivity, widths, or lengths of the internal resistance electrodes are adjusted to adjust ESR.

10. The board having a multilayer ceramic capacitor of claim 8, wherein the first and third internal electrodes are disposed on the same first dielectric layers while being spaced apart from each other, and the second and fourth internal electrodes are disposed on the same second dielectric layers while being spaced apart from each other.

11. The board having a multilayer ceramic capacitor of claim 8, wherein the first and third internal electrodes are disposed on different first dielectric layers, and the second and fourth internal electrodes are disposed on different second dielectric layers.

12. The board having a multilayer ceramic capacitor of claim 8, further comprising dummy electrodes disposed on at least portions of the first to third dielectric layers and exposed to end surfaces of the ceramic body in a length direction of the ceramic body.

13. The board having a multilayer ceramic capacitor of claim 8, further comprising a dummy electrode disposed on at least a portion of the first to third dielectric layers and exposed to the upper surface of the ceramic body.

14. The board having a multilayer ceramic capacitor of claim 8, wherein the multilayer ceramic capacitor further includes a mark formed on a portion of a side surface of the ceramic body close to the upper surface of the ceramic body.

* * * * *